United States Patent [19]

Temple

[11] 4,327,367

[45] Apr. 27, 1982

[54] THYRISTOR WITH EVEN TURN-ON LINE POTENTIAL AND METHOD WITH 1-MICRON TO 5-MIL WIDE ALIGNMENT REGION BAND

[75] Inventor: Victor A. K. Temple, Clifton Park, N.Y.

[73] Assignee: Electric Power Research Institute, Inc., Palo Alto, Calif.

[21] Appl. No.: 172,449

[22] Filed: Jul. 25, 1980

Related U.S. Application Data

[63] Continuation-in-part of Ser. No. 899,309, Apr. 24, 1978, abandoned.

[51] Int. Cl.³ .............................................. H01L 29/74
[52] U.S. Cl. ........................................ 357/38; 357/30; 357/51; 357/55; 357/86
[58] Field of Search ..................... 357/38, 86, 55, 51, 357/30

[56] References Cited

U.S. PATENT DOCUMENTS 3,611,066 10/1971 Knaus ................................... 357/38
3,624,464 11/1971 Gentry ................................. 357/38

OTHER PUBLICATIONS

W. Dodson et al., "Probed Det. of T-O Speed of Large Area Thys" IEEE Trans, on Elec. Dev., vol. Ed-13 #5, May 1965, pp. 478-484.

A. Munoz-Yague et al., "Opt. Design of Thyris. Gate-Emitter Geom.," IEEE Trans. on Elec. Dev., vol. Ed-23 #8, Aug. 1976, pp. 917-924.

S. Sze, "Physcis of Semiconductor Devices," ©1969, John Wiley and Sons, Wiley Interscience, pp. 119-126.

Primary Examiner—Joseph E. Clawson, Jr.
Attorney, Agent, or Firm—Flehr, Hohbach, Test, Albritton & Herbert

[57] ABSTRACT

A thyristor having an emitter on the top surface of a semiconductor body and also having metalized areas on the top surface forming electrodes is provided with an alignment region extending beneath the edge of the gate electrode. The alignment region is formed in the thyristor base zone and is of the same conductivity type as the thyristor emitter. Precise spacing between the alignment region and the emitter is readily achieved because both are formed in a single masking step. Slight misalignment of the gate metalization on the top surface is corrected for because the alignment region precisely defines the line closest to the emitter at which the gate electrode contacts the base. The turn-on potential at the emitter-based junction is therefore uniform along its entire length.

7 Claims, 23 Drawing Figures

FIG. 23

THYRISTOR WITH EVEN TURN-ON LINE POTENTIAL AND METHOD WITH 1-MICRON TO 5-MIL WIDE ALIGNMENT REGION BAND

CROSS-REFERENCE TO RELATED APPLICATION

This application is a continuation-in-part of copending application Ser. No. 899,309, filed Apr. 24, 1978 now abandoned.

BACKGROUND OF THE INVENTION

The invention relates generally to thyristors, and more particularly to thyristors of the type having emitter and base zones extending to a top surface on which cathode and gate electrodes are formed.

Separate masking steps are generally employed in forming the emitter zone and the electrode metalization areas on the top surface of a thyristor device. The thyristor emitter covers a portion of the top surface of a semiconductor chip, with the emitter-based junction extending to the top surface and defining a turn-on line. The position of the gate metalization with respect to the turn-on line can significantly affect the turn-on potential along the emitter-base junction. To produce thyristors with high di/dt ratings it is necessary to provide both a long turn-on line and relatively even turn-on potential along its length during triggering. The separate masking steps employed in forming the emitter zone and gate metalization makes precise gate alignment difficult. If the masks are not precisely aligned the metalization will be at unequal distances from the turn-on line. The result is nonuniform turn-on with a resultant lower di/dt rating.

One prior art technique for correcting emitter-gate misalignment is to etch the emitter zone to a precise distance from the edge of the gate metalization. Such a technique cannot alter the position of emitter shorts located at fixed positions within the emitter zone. Such emitter shorts join the thyristor base zone to the cathode metalization at discrete locations and play an important part in determining the potential along the turn-on line. Unless the gate metalization is a substantially uniform distance from the closest emitter shorts, uneven turn-on line potential will result even if an alignment etch is used.

OBJECTS AND SUMMARY OF THE INVENTION

It is the general object of the present invention to provide a thyristor with even turn-on line potential.

Another object of the invention is to provide a method of forming a thyristor which compensates for any misalignment which occurs between the emitter and metalization masks.

Another object of the invention is to provide a method of forming a thyristor with even turn-on time potential without increasing the cost or complexity of the resultant thyristor.

Accordingly, a thyristor is provided having a semiconductor body with a top surface and at least four zones of alternate conductivity type. The body includes a first emitter zone of a first conductivity type extending to the top surface and a base zone adjacent the emitter zone and also extending to the top surface. A turn-on junction is formed at the interface of the emitter and base zones. An alignment region of the first conductivity type is also formed in the base zone, spaced apart from the emitter zone and extending to the top surface. The interface of the base zone and the alignment region defines an alignment edge on the top surface spaced an equal minimum distance from the turn-on junction at all points. The alignment region is formed between the alignment edge and the emitter zone. A control electrode is provided on the top surface for supplying gate current. The control electrode is in contact with the base zone and also the alignment region, and overlies the alignment edge. The alignment edge therefore defines the line closest to the emitter zone at which the control electrode contacts the base zone.

The method of forming the thyristor includes forming the emitter zone and the alignment region of semiconductor material of a first conductivity type. The emitter zone and alignment region are formed in contact with a base zone of the opposite conductivity type. A control electrode for supplying gate current is then formed on the top surface in contact with the base zone and the alignment region, the control electrode extending no closer to the emitter zone than the alignment region.

DESCRIPTION OF THE PREFERRED EMBODIMENT

Figure 1:
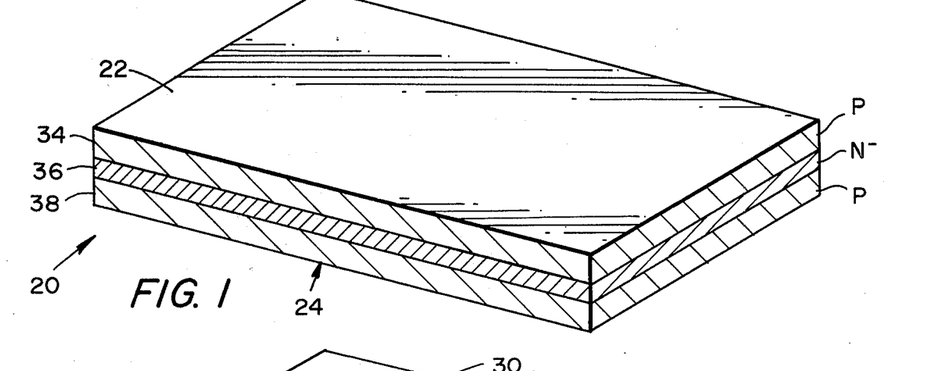
FIGS. 1–5 are perspective views in partial cross-section showing the method of forming a thyristor according to the present invention.

A thyristor device according to the present invention is formed beginning with a foundation semiconductor body 20 having opposed top and bottom surfaces 22 and 24, respectively. Body 20 is typically formed of monocrystalline silicon processed to provide at least three layers of alternate conductivity type. In the preferred embodiment body 20 has a PNP structure having intermediate pn junctions substantially parallel with surfaces 22 and 24. A suitable method of forming body 20 begins with an N-type silicon chip into which P type impurities are subsequently diffused through the top and bottom surfaces. One or more of the conductivity zones may alternatively be formed by epitaxial growth or ion implantation.

Figures 2, 3:
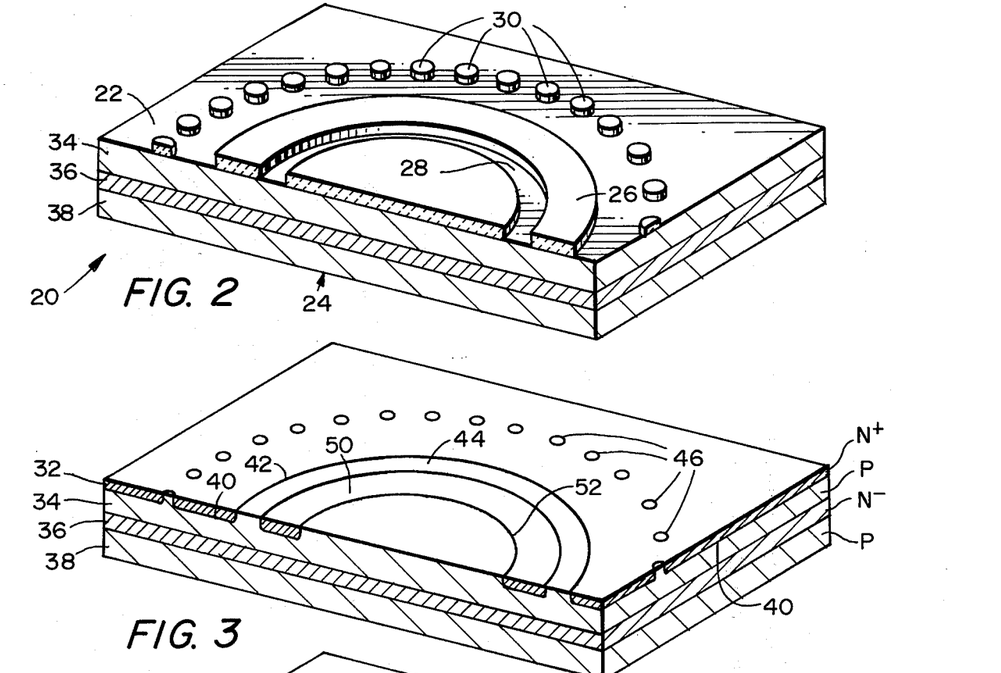
Figure 4:
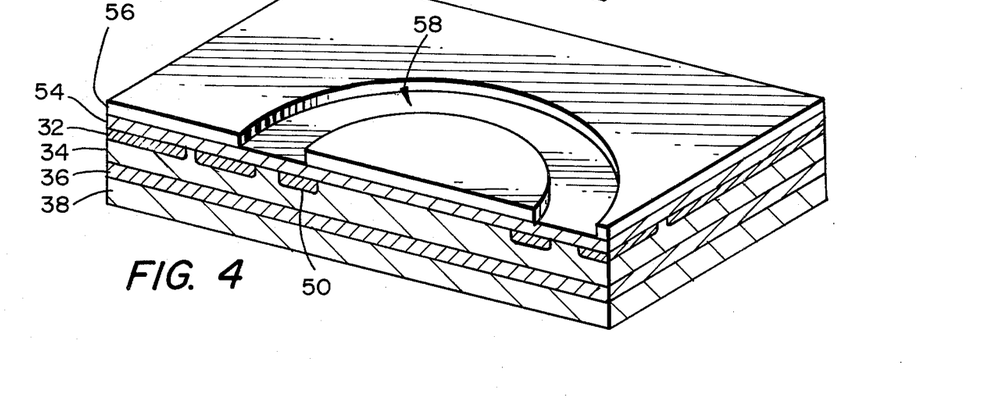

A method according to the invention of forming a thyristor from body 20 is illustrated in FIGS. 2–4. Referring to FIG. 2, top surface 14 is initially coated with a first masking layer 26, formed of a suitable insulating material such as silicon dioxide. Masking layer 26 is first laid down over all of top surface 22 in any suitable manner, such as by thermal growth or deposition. Portions of masking layer 26 are then removed by conventional photolithographic and etching techniques to provide the masking pattern shown in FIG. 2. Mask 26 includes a ring-shaped opening 28 and a plurality of separated circular mask portions 30 on the top surface of the body.

After first mask 26 is created, regions of N conductivity type are formed on the exposed portion of the P-type top surface of body 20. Suitable diffusion techniques are preferably employed to form the N-type regions, although other techniques such as ion implantation could be used. The resultant semiconductor structure, with mask 26 removed by etching or the like, is shown in FIG. 3. Body 20 has four zones of alternate conductivity type. Emitter zone 32 extends to and covers a portion of the top surface, contacting adjacent base zone 34 which also extends to the top surface. The body also includes a third zone 36 adjacent the base zone, and a fourth zone 38 extending to bottom surface 24. The resultant thyristor body has an NPNP structure with third zone 36 designated N− and emitter zone 32 designated N+, in FIG. 3, to indicate the relatively higher level of N-type doping in the emitter zone.

At the interface between the emitter and base zones is a turn-on junction 40 which extends to the top surface at 42. Line 42 forms a circle on the top surface, with emitter 32 encircling a surface base portion 44 of base zone 34. Outside circular line 42 are a plurality of small circular base portions 46 which extend through the emitter zone to become emitter shorts. Line 42 forms the turn-on line of the thyristor, and emitter shorts 46 are each spaced an equal distance outside turn-on line 42 to provide a substantially encircling line of emitter shorts. It should be understood that additional emitter shorts 46 are customarily provided on the top surface at greater distances from turn-on line 42.

Within the surface base portion 44 is formed an alignment region 50 of the same conductivity type as emitter zone 32. Alignment region 50 is spaced apart from the emitter zone and extends to top surface 22 to define an alignment edge 52 at the interface of the alignment region and base zone 34. The alignment region is between edge 52 and emitter 32. In the first embodiment, alignment edge 52 is the inner boundary of the annular ring-shaped alignment region 50. Alignment edge 52 is spaced an equal minimum distance from turn-on junction 40 at all points. Since the minimum distance between the alignment edge and the turn-on junction is along turn-on line 42, alignment edge 52 and turn-on line 42 are concentric circles.

Figure 5:
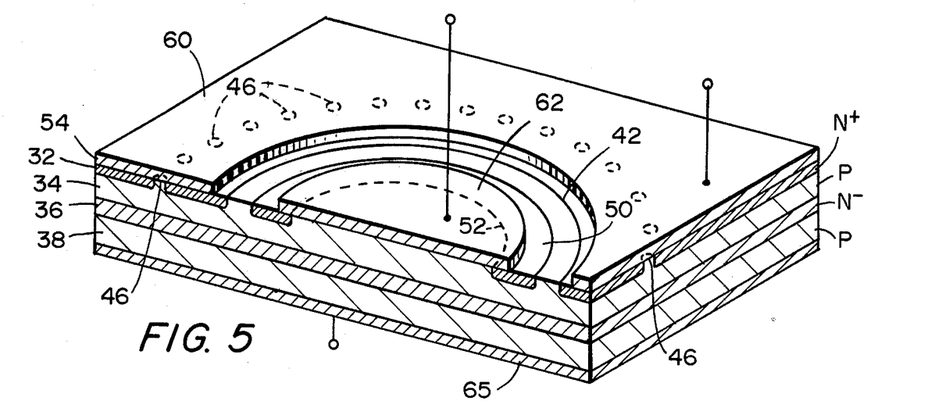

Following formation of the four-layer body of FIG. 3, a layer of metalization is applied to top surface 22. Referring to FIG. 4, metalization layer 54 initially covers the entire top surface 22 of body 20. Any suitable conductive metal can be used; for example, aluminum. After the metal is deposited, portions are removed to separate the metal into emitter and gate electrodes. This done using second masking layer 56, deposited on metalization layer 54. An opening 58 is formed in the mask by conventional photolithographic and etching techniques. Opening 58 defines the portions of metal to be removed. Following formation of second mask 56, an etching step is performed utilizing an etching solution which attacks the metallic layer. The resulting metalization pattern is shown in FIG. 5. An emitter electrode 60 remains outside turn-on line 42, forming the thyristor cathode electrode. A control electrode 62 remains on the top surface in contact with base zone 34 for supplying gate current to the thyristor. Electrode 62 covers the entire area of the surface base portion within alignment edge 52, overlying the alignment edge and contacting alignment region 50. Electrode 62 extends no closer to emitter zone 32 than does alignment region 50.

The completed thyristor includes a third metalized electrode on the bottom surface of body 20 in contact with fourth layer 38. Bottom electrode 65 forms the anode contact of the thyristor. Anode contact 65 is applied either simultaneously with the top surface metalization, or at another time.

Figure 6:
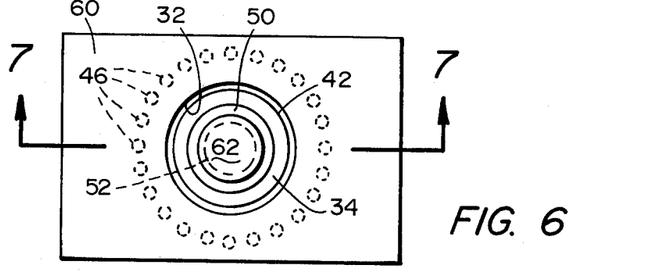
FIG. 6 is a partial top view of the thyristor of FIG. 5.

The resultant thyristor shown in FIGS. 5 and 6 has a radial-emitter geometry with a centrally-disposed gate electrode. Alignment region 50 is interposed between the gate electrode and the emitter. As such, the points closest to the emitter at which electrode 62 contacts the base zone are along alignment edge 52. The advantage of this configuration during thyristor turn-on is described below.

In operation, the first embodiment thyristor shown in FIGS. 5 and 6 provides the normal thyristor switching characteristics. When anode 65 is forward biased relative to cathode 60, only a small leakage current passes through the device, due to carrier depletion in the region near the reverse-biased junction between zone 34 and 36. If a small positive gate current is applied to the base zone by way of electrode 62, electrons begin to flow in large numbers across turn-on junction 40. The electrons pass through the device to the anode, switching the thyristor into forward conduction in the usual manner. Electrons cross turn-on junction 40 initially at turn-on line 42, which is the closest approach of emitter 32 to the source of gate current.

Figure 7:
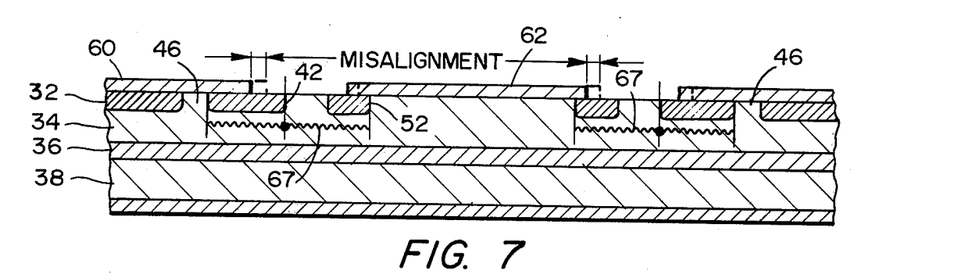
FIG. 7 is a cross-sectional view taken along line 7—7 of FIG. 6 showing the effect of mask misalignment.
Figure 8:
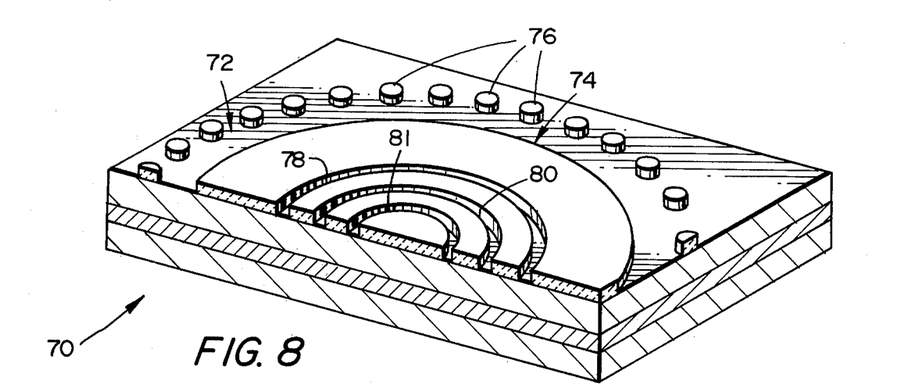
FIGS. 8 and 9 are perspective views in partial cross-section showing the method of forming an alternative embodiment of a thyristor according the present invention.

FIG. 7 illustrates the way in which the present invention compensates for mask misalignment to provide even potential along the length of the turn-on line. When a current is initially supplied to gate 62, a voltage gradient is produced through base zone 34 between the gate and emitter shorts 46. The sheet resistance of the semiconductor material in the base zone is diagrammatically represented by resistor 67. The ohmic value of resistor 67 depends on the distance through the base zone from gate 62 to emitter short 46. The voltage at turn-on junction 40 in turn depends on the position of turn-on line 42 relative to emitter shorts 46 and alignment edge 52. In the present invention, the relative positions of alignment edge 52, turn-on line 42, and emitter shorts 46 are always precisely fixed during the first masking step. Thus, even if the metalization mask 56 is misaligned slightly with respect to the various N+ regions, as shown in phantom in FIG. 7, the relative distances through the base zone between gate 62, turn-on line 42, and the emitter shorts remain unchanged. The result is an equal turn-on line potential along the entire length of the turn-on line.

The present invention provides effective compensation for misalignment between emitter formation and metalization masking steps, without any increase in the cost or complexity of the resultant thyristor. The alignment region is formed substantially simultaneously with the emitter zone in a single step. As such, there is no additional cost associated with the formation process. The degree of metalization misalignment allowed for is determined by the width of the alignment region. Preferably the alignment region is as narrow as possible given the specific degree of misalignment normally encountered. Even turn-on line potential is achieved yielding a higher di/dt rating without the sacrifice of any other performance characteristics of the thyristor.

Alternative embodiment thyristors can employ the N+ alignment region of the present invention to achieve even turn-on line potential. FIGS. 8-11 illustrate one such alternative embodiment incorporating an amplifying stage. In this embodiment a semiconductor body 70 is used, having the same PNP construction as body 20 shown in FIG. 1. Body 70 has a top surface 72 on which is initially formed a first masking layer 74. The mask is preferably formed of an insulating material such as silicon dioxide formed by deposition or thermal growth. By means of conventional photolithographic and etching techniques, portions of the masking layer are removed to form the masking pattern shown in FIG. 8. As in the first embodiment, circular portions 76 are left unremoved to provide emitter shorts. Ring-shaped openings 78, 80 and 81 are formed to expose corresponding portions on top surface 72.

Figure 9:
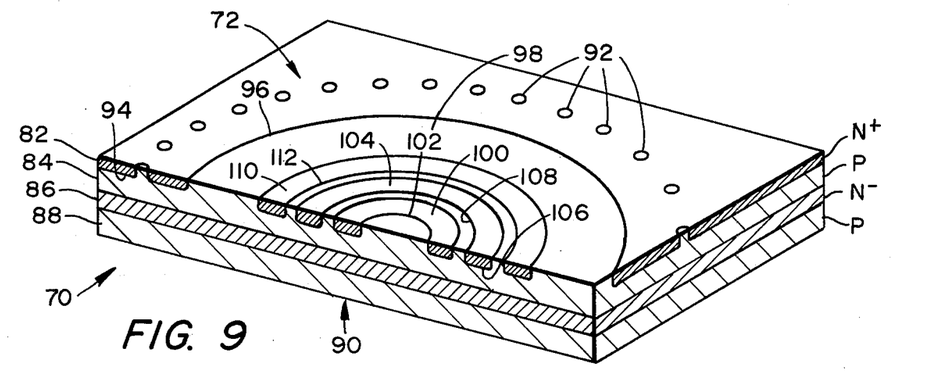

Following formation of first mask 74, N+ regions are formed in the exposed portions of top surface 72. Suitable diffusion techniques are preferably employed to form N+ regions, although other techniques such as ion implantation could be used. The resultant semiconductor configuration, with mask 74 removed by etching or the like, is shown in FIG. 9. An N+ emitter zone 82 extends to top surface 72. The adjacent P-type base zone 84 also extends to the top surface. Adjacent third zone 86 is designated N— in FIG. 9 to indicate a relatively lower level of N-type doping than emitter zone 82. Fourth zone 88 is P-type, extending to bottom surface 90. Within emitter zone 82 are small circular base portions 92 forming the first line of emitter shorts. As in the first embodiment, the interface between the emitter and base zones is a turn-on junction 94 extending to the top surface to form a circular turn-on line 96.

Within the surface base portion 98 encircled by emitter 82 are a plurality of ring-shaped regions of N+ conductivity type. Inner ring 100 comprises the alignment region of the thyristor, equivalent to region 50 of the first embodiment. Region 100 defines an alignment edge 102 at the interface with base zone 84. The components of the amplifying stage are formed between and spaced apart from alignment region 100 and turn-on line 96. Intermediate N+ ring 104 is the amplifying stage emitter. Interface 106 with the base zone defines the amplifying stage turn-on junction, with the edge closest to alignment region 100 being the amplifying stage turn-on line 108. Between amplifying stage emitter 104 and the main emitter 82 is an amplifying stage alignment region 110 defining an amplifying stage alignment edge 112 at the interface with base zone 84. As with inner alignment edge 102, amplifying stage alignment edge 112 is spaced an equal minimum distance from the emitter-base junction. Alignment region 102, amplifying stage emitter 104, and amplifying stage alignment region 110 form concentric annular rings on top surface 72, all being concentric with turn-on line 96. Thus, the minimum distance from amplifying stage turn-on junction 106 to alignment edge 102 is equal at all points and the minimum distance from the turn-on junction 94 to amplifying stage alignment edge 112 is equal at all points. Alignment edge 102 is the inner boundary of ring 100 and amplifying stage alignment edge 112 is the inner boundary of ring 110.

Following formation of the four-layer body of FIG. 9, a pattern of metalization is provided on top surface 72 in the same manner as in the first embodiment. A layer of conductive metalization is first applied over the entire top surface and then portions are removed by conventional photolithographic and etching techniques to produce a metalization pattern shown in FIGS. 10 and 11. An emitter electrode 114 is provided outside turn-on line 96 in contact with emitter zone 82. Electrode 114 forms the cathode contact of the thyristor. Electrode 114 contacts base zone 84 at circular portion 92 to provide a line of emitter shorts. A control electrode 116 contacts base zone 84, covering the surface base portion within alignment edge 102, and also contacts alignment region 100. Electrode 116 overlies alignment edge 102, which defines the line closest to amplifying stage turn-on line 108 at which electrode 116 contacts the base. Electrode 116 supplies gate current to the thyristor. An amplifying stage electrode 118 is also provided on top surface 72 in contact with amplifying stage emitter 106 and base zone 84, and extending over part of amplifying stage alignment region 110. Amplifying stage electrode 118 overlies amplifying stage alignment edge 112, which serves to define the line closest to emitter zone 82 at which the amplifying stage electrode contacts the base zone. As in the first embodiment, an additional electrode 120 is provided on bottom surface 90 in contact with fourth zone 88 to provide a thryistor anode contact.

Figure 10:
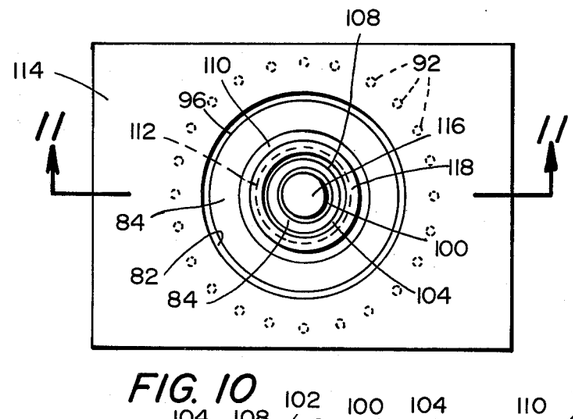
FIG. 10 is a partial top view of the embodiment formed in FIGS. 8 and 9.
Figure 11:
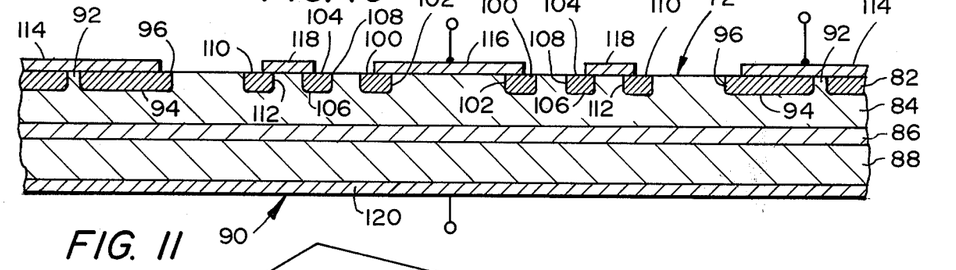
FIG. 11 is a cross-sectional view taken along line 11—11 of FIG. 10.

In operation, the amplifying gate thyristor of FIGS. 10 and 11 functions in a manner similar to the first embodiment. With anode 120 forward biased relative to cathode 114 only a small leakage current flows through the device until it is switched into conduction. When a small positive gate current is supplied to base 84 by way of electrode 116 the amplifying stage of the device is turn on, initially along turn-on line 108. Electrons are thus caused to flow across the base-amplifying stage emitter junction 106, making amplifying stage electrode 118 positive. An amplifying stage gate current is thus supplied to base zone 84, turning on the thyristor at junction 94, initially along turn-on line 96. As electrons flow in large numbers across junction 94 the device switches into forward conduction, allowing a large forward current to flow.

As in the first embodiment, the presence of alignment region 100 and amplifying stage alignment region 112 compensates for any misalignment between the metal electrodes and the N+ pattern on top surface 72. The distance between alignment edge 102 and amplifying stage turn-on line 108 is equal at all points and insures an even turn-on of the amplifying stage. Similarly, the distance between amplifying stage alignment edge 112 and turn-on line 96 is equal at all points, assuring an even turn-on of main emitter 82. Since the alignment edges and turn-on lines are all formed during the same masking step, precise spacing and control is readily achieved. A small misalignment during the second masking step forming the metalization pattern does not reduce the thyristor di/dt rating.

Figure 12:
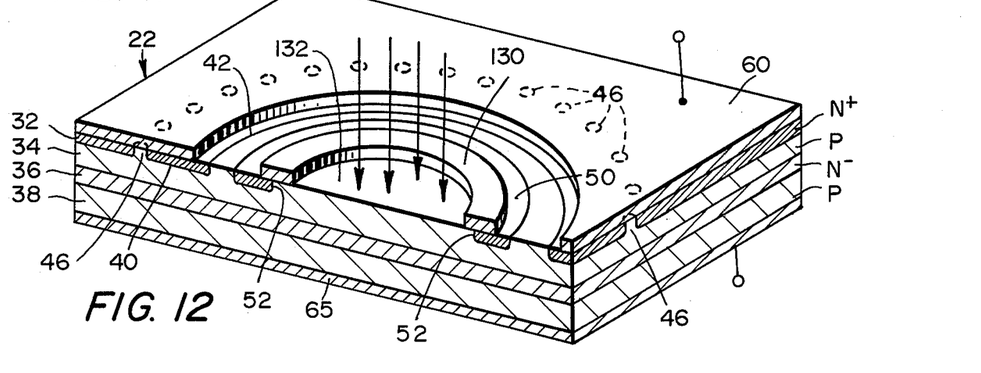
FIG. 12 is a perspective view in partial cross-section showing another alternative embodiment of a thyristor according to the present invention.

The present invention can also be employed with other emitter and electrode configurations to produce even turn-on line potential. In another alternative embodiment shown in FIGS. 12–14 the invention is incorporated into a light-fired thyristor. In this embodiment, the body 20 of the first embodiment is employed. The fabrication steps shown in FIGS. 1–4 result in a thyristor body having four zones of alternate conductivity type with a radial N+ emitter 32 on the top surface, as shown in FIG. 3. Body 20 is then covered with a layer of metalization and a masking layer, of the type shown in FIG. 4. The second masking step in this embodiment produces a metalization pattern slightly different from that of the first embodiment. In this embodiment the control electrode is in the shape of an annular ring 130 on top surface 22. Electrode 130 encircles an exposed light-receiving region 132 of base zone 34.

Figure 13:
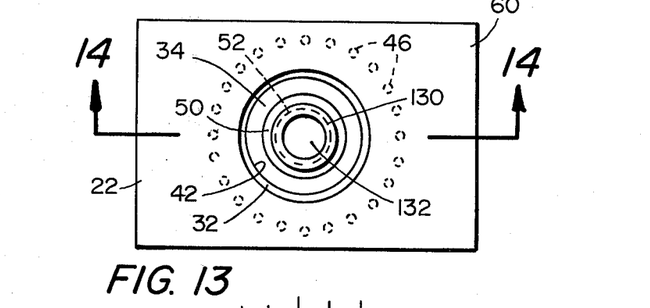
FIG. 13 is a partial top view of the thyristor of FIG. 12.

As in the first embodiment, an alignment region 50 in the form of an annular ring is provided on top surface 22. The alignment region defines an alignment edge 52 on the top surface spaced an equal minimum distance from emitter turn-on junction 42 at all points. Control electrode 130 is in contact with the light-receiving portion 132 of base 34 and alignment region 50, overlying alignment edge 52. Alignment edge 52 defines the line closest to emitter zone 32 at which control electrode 130 contacts the base zone. As shown in FIG. 13, light-receiving region 132 is centrally disposed on top surface 22 and is circular. The light-receiving region is adjacent control electrode 130 and spaced from emitter 32 a distance greater than the control electrode so that gate current will pass first to the control electrode prior to firing the thyristor.

Figure 14:
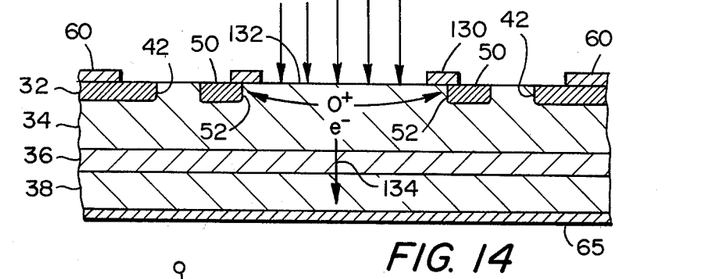
FIG. 14 is a cross-sectional view taken along line 14—14 of FIG. 13 showing the effect of photogeneration in the base zone.

The operation of the light-fired thyristor of this embodiment is shown in FIG. 14. When incident light strikes the light-receiving region 132, hole carrier pairs are generated in base zone 34 by well known photogenerative processes. If the thyristor is forward biased with anode 65 positive and cathode 60 negative, the electrons in the base zone will immediately move toward the anode, in the direction of arrow 134. Hole current moves radially outwardly to elecrode 130, where a positive charge collects until a sufficient voltage is built up to fire the thyristor. Electrode 130 serves to equalize the charge produced by photogeneration throughout region 132. As in the first embodiment, the presence of alignment region 50 compensates for any misalignment in the surface metalization relative to emitter zone 32. The distance from alignment edge 52 to turn-on line 42 is precisely fixed in the first masking step. Thus, even with electrode misalignment such as shown for the first embodiment in FIG. 7, an even turn-on potential is developed along the entire length of turn-on line 42.

Figure 15:
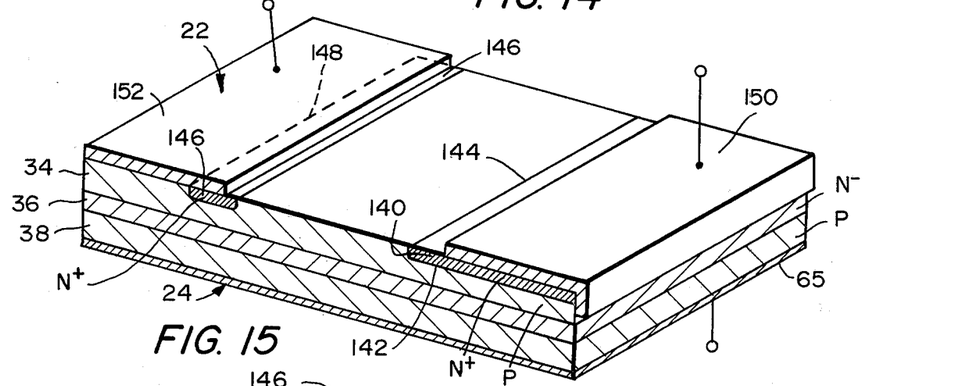
FIGS. 15 and 16 are perspective and top views of another embodiment of a thyristor according the the present invention.
Figure 16:
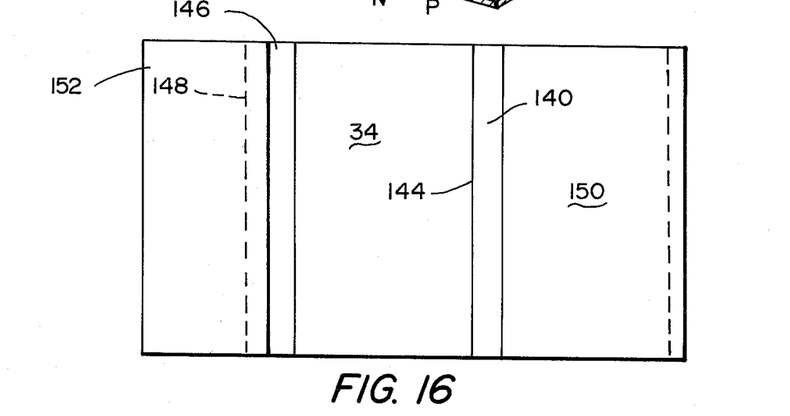

Another embodiment of the invention is shown in FIGS. 15 and 16. In this embodiment a semiconductor body 20 of the type shown in FIG. 1 is provided with a non-radial-emitter configuration on the top surface. In the first masking step forming the emitter zone a mask is employed which forms parallel straight junctions between the N+ and base zones. The N+ emitter zone 140 extends along one side of the top surface, defining a turn-on junction 142 and a turn-on line 144 on the top surface. An alignment region 146 defines an alignment edge 148 in the form of a substantially straight line on the top surface extending parallel to the closest approach of junction 142, which is turn-on line 144. Alignment region 146 extends between alignment edge 148 and the emitter zone, spaced apart from turn-on line 144. The top surface of this embodiment is provided with metalized electrodes 150 and 152. Cathode 150 extends over emitter 140, and also down the side of the body to contact base 34, forming an emitter short. Electrode 152 is a control electrode for supplying gate current and is disposed on top surface 22 in contact with base zone 34 and alignment region 146, overlying alignment edge 148. Alignment edge 148 defines the line closest to the emitter zone at which the control electrode contacts the base zone. An anode contact 65 is also provided on bottom surface 24 in contact with fourth zone 38, as in the first embodiment.

In operation, the embodiment of FIGS. 15 and 16 provides thyristor switching in the same manner as the first embodiment. When anode 65 is forward biased relative to cathode 150, only a small leakage current passes through the device. If a small positive gate current is supplied to electrode 152, the thyristor switches into forward conduction with turn-on occurring first along turn-on line 144. Misalignment between the metalization areas on the top surface and the turn-on line is compensated for by alignment region 146. Even turn-on potential is thereby achieved.

As shown by the alternative embodiments, the present invention can be effectively employed in thyristors having various emitter zone patterns. An N+ alignment region can be used in still other thyristor configurations and is not restricted to straight or circular turn-on line patterns. It is only necessary that the alignment edge defined by the N+ alignment region be spaced equally from the thyristor turn-on line at all points. When using the invention it is important that the gate electrode not contact the base zone at a point closer than the alignment region. The invention can be incorporated in thyristor fabrication processes at no additional cost or complexity and produces no undesirable effects on thyristor performance. Furthermore, because even turn-on potential is assured, the di/dt rating of the thyristor is increased.

Figure 17:
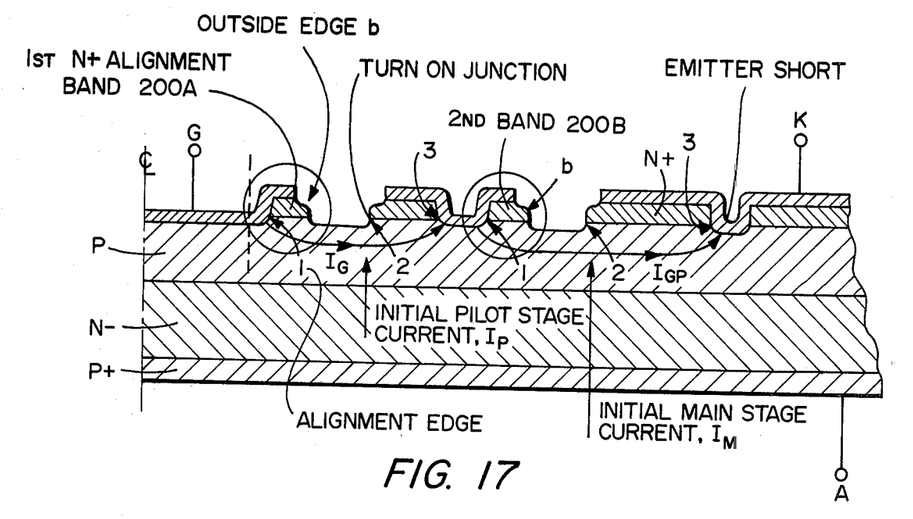
FIG. 17 is a cross-sectional view of an alternative embodiment of a thyristor embodying the present invention.

Alternative thyristor constructions are possible using the present invention. For example, the light fired embodiment shown in FIGS. 12–14 could be provided with amplifying stages as in the embodiment of FIGS. 8–11. Similarly, amplifying stage could be incorporated in the embodiment of FIGS. 15 and 16. The method of forming the preferred embodiments is intended to be illustrative only. FIG. 17 illustrates an alternative method of forming N+ alignment band regions rather than a masked diffusion process as has been described above. Instead of this step, a masked etch is used, which defines N+ alignment band regions 200A and 200B. In this process the N+ region is etched away where it is not wanted. In this case, and in the masked diffusion case also, a single mask step must, of course, be responsible for determining the distances from the inner edge of the alignment band (the alignment edge) marked 1 in FIG. 17 to the turn-on line or junction marked "2", and from the turn-on line 2 to the first line of the emitter shorts marked "3".

The N+ alignment bands 200 are horizontally defined by their width between the alignment edge "1" and the outside edge marked "b", which is the edge, of course, facing the turn-on junction "2". In the embodiment shown in FIG. 17 there is both a pilot stage, indicated by the pilot stage current $I_p$ and a main stage indicated by the main stage current $I_m$. Flowing between the gate electrode marked G and the pilot stage is a current $I_G$ and then between the pilot stage and the main stage, a second current $I_{GP}$, which is a combination of $I_G$ and $I_P$.

It has been discovered that at the point "b", which is the outside edge of the N+ alignment bands 200, arcing failure might occur from surface and dielectric breakdown from the voltage and electric field transients during the turn-on stage when current under the N+ alignment band is large. Thus, it is desirable to eliminate the local breakdown effects at the outside edges "b", and in addition, the avalanche breakdown of the N+ alignment band and P base junction. In other words, the object is to lower both the reverse voltage at the points "b" for a given current and to reduce the local electric field at "b" caused by a given reverse junction voltage. A further object is to provide improved dielectric and possivating material coverage of the junction at 37 b".

Figures 18, 20:
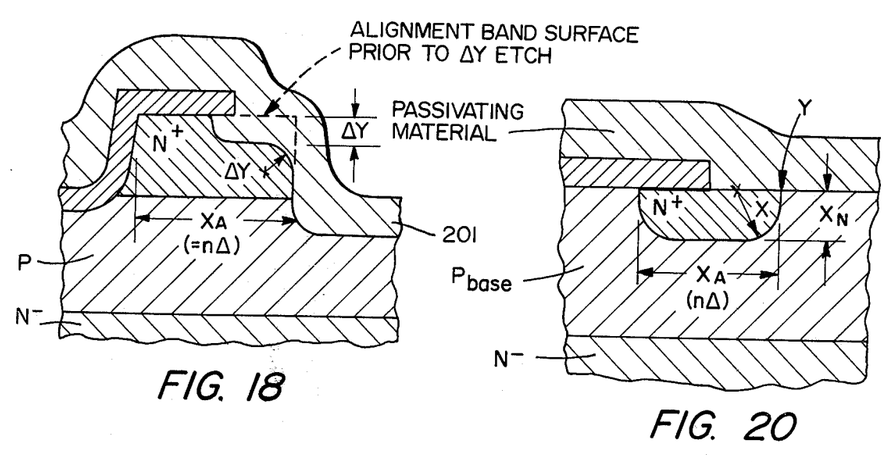
FIG. 18 is an enlarged view of an alignment band section of FIG. 17.
FIG. 20 is an enlarged view of an alignment band portion of FIG. 19.

This can be accomplished, in many cases, by merely making the N+ alignment bands 200 as narrow as possible so that, as illustrated in FIG. 18, the alignment band width $X_A$ is specified to be $n\Delta$ where $\Delta$ is the actual amount of misalignment expected in a given production line of thyristor devices in the electrode deposition step. It has been found that the width of the N+ alignment band on a finished device should be between 1 and $3\Delta$, i.e. less than 10 mils and preferably on the order of 1 micron to 5 mils with current technology. In any case, it should be no larger than the amount necessary to correct misalignment.

Thus, the narrow alignment band will serve to reduce transient reverse voltages occurring at the outside edge, "b", of the alignment band. This is all that is needed to reduce the probability of junction avalanche. However, in some cases, there may be failures due to dielectric breakdown which is due to the combination of high voltage and high local curvature at "b". Thus, in the structure shown in FIG. 18 the outside edge "b" is rounded to form a radius of $\Delta Y$. This is done by using the already patterned metal contact as a mask. The wafer is then dipped in suitable isotropic silicon etch for a time that will etch away a thickness $\Delta Y$ of the N+ region. Alternatively, or after this etch, it is desirable but often may not be necessary to apply a suitable passivating material designated 201 to the surface to improve both the surface junction avalanche breakdown voltage and for improved dielectric strength to reduce surface arcing.

Figure 19:
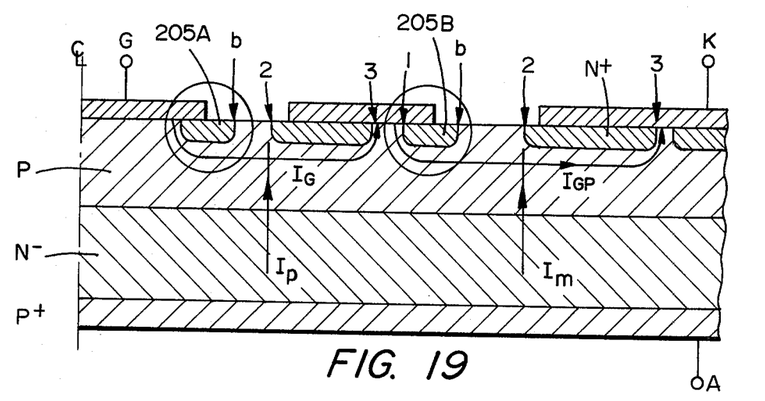
FIG. 19 is a cross-sectional view of a thyristor in accordance with another embodiment of the present invention.

FIGS. 19 and 20 illustrate the masked diffusion format of the embodiment of FIGS. 17 and 18, where there are relatively narrow N+ alignment bands 205A and 205B. Here, as in the case of FIGS. 17 and 18, $X_A$, the horizontal width of the alignment band is carefully controlled to reduce the amount of reverse electric field. However, surface curvature is not a problem here. Instead, avalanche breakdown voltage of the junction is dominated by the curvature of the N+ alignment band which occurs during the diffusion period. One way to reduce this effect is to provide for deeper N+ diffusion. This is so because the radius of curvature in diffused junctions is approximately equal to the junction depth $X_N$.

Figure 23:
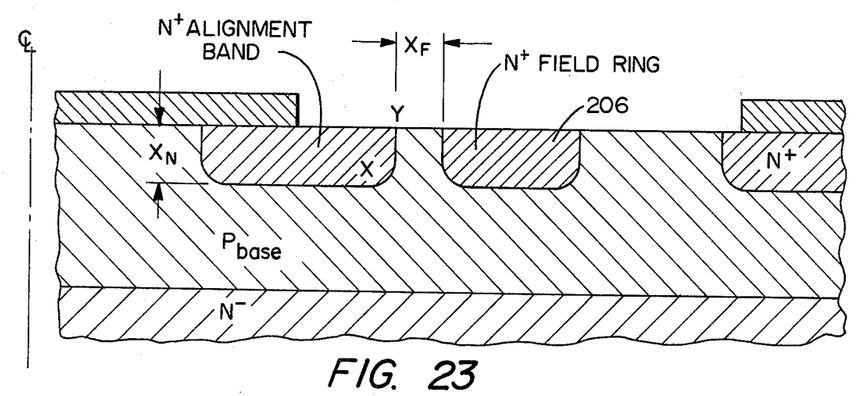
FIG. 23 is a cross-sectional view of yet another embodiment of a thyristor according to the present invention.

Yet another technique to increase resistance to avalanche breakdown voltage in a structure like FIG. 19 is illustrated in FIG. 23 where an N+ field limiting ring is provided.

Figure 21:
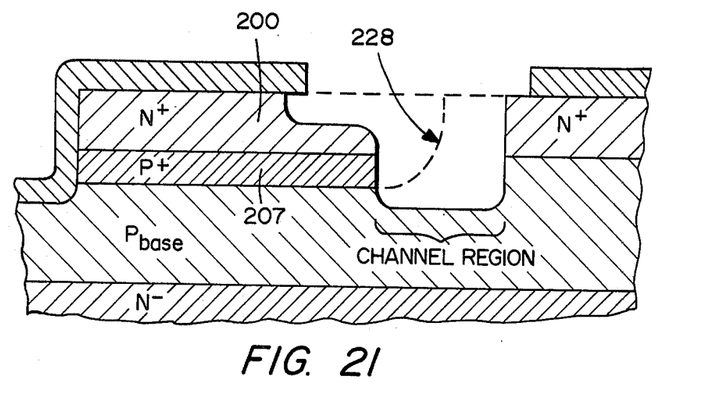
FIG. 21 is a cross-sectional view of another embodiment of a thyristor according to the present invention.
Figure 22:
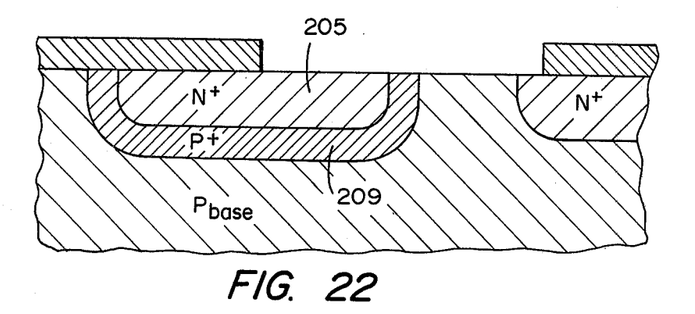
FIG. 22 is a cross-sectional view of another embodiment of a thyristor according to the present invention.

While a minimum alignment band width $X_A$ will reduce the reverse bias, it may also be possible to reduce this bias by reducing the P base sheet resistance under the N+ alignment band. This is best done with an etch defined junction as illustrated in FIG. 21, where a P+ layer 207 underlies the N+ alignment band 200. Dashed lines 208 show the P+P junction before the N+ diffusion. In the case of a masked diffusion process, FIG. 22 illustrates a P+ region 209 underlying the N+ alignment band 205.

Thus, the present invention provides a thyristor with even turn-on line potential. The method of forming the thyristor compensates for any misalignment which occurs between the emitter and the metalization masking steps. The method of formation does not increase the cost or complexity of the resultant thyristor. Problems of reverse voltage breakdown with respect to the alignment bands are also compensated for.

What is claimed is:

1. A thyristor comprising: a semiconductor body having a top surface and having at least four zones of alternate conductivity type; including an emitter zone of a first conductivity type extending to said top surface having an emitter electrode on said surface in contact with said emitter zone, and a base zone adjacent said emitter zone and also extending to said top surface and having a control electrode on said surface in contact with said base zone, a turn-on junction at the interface of said emitter and base zone, means for correcting for a predetermined expected misalignment, $\Delta$, between said emitter and control electrodes and said emitter and base zones respectively, including an alignment band of said first conductivity type in said base zone spaced apart from said emitter zone and extending to said top surface, the interface of said base zone and said alignment band defining an alignment edge on said top surface spaced an equal minimum distance from said turn-on junction at all points, said alignment band being between said alignment edge and said emitter zone, and having a horizontal width between said alignment edge at one extremity and an outside edge facing said turn-on junction at the other extremity, such width being between 1 micron and 5 mils which corresponds to 1 to $3\Delta$, said control electrode being in contact with said alignment band and overlying said alignment edge, said alignment edge defining the line closest to said emitter zone at which said control electrode contacts said base zone.

2. A thyristor as in claim 1 where said outside edge of said alignment band is defined by a masked etch and where the resulting corner is rounded to reduce the local electric fields.

3. A thyristor as in claim 1 where said outside edge of said alignment band is defined by a masked etch and where a passivating layer covers said outside edge.

4. A thyristor as in claim 1 where said outside edge of said alignment band is defined by a diffusion step and where the depth of diffusion of said alignment band is controlled to increase the radius of curvature in the diffused junction whereby the local electric field is reduced.

5. A thyristor as in claim 4 wherein the passivating layer covers the outside edge of the alignment band.

6. A thyristor as in claim 1 together with an emitter electrode in contact with said emitter zone, said emitter electrode also contacting said base zone at a plurality of discrete points to form emitter shorts, said turn-on junction being between said emitter shorts and said alignment edge, the emitter shorts disposed closest to said turn-on junction being spaced equally from said turn-on junction whereby a voltage applied between said alignment edge and said emitter shorts produces substantially uniform biasing along said turn-on junction.

7. A thyristor as in claims 1, 2, 3, 4, 5 or 6 where an enhanced conductivity zone of said base zone conductivity type underlies said alignment band whereby base sheet resistance is reduced.

* * * * *